(12) United States Patent
Shin et al.

(10) Patent No.: US 10,665,472 B2
(45) Date of Patent: May 26, 2020

(54) SYSTEM AND METHOD FOR REMOVING FOREIGN SUBSTANCES BY USING ELECTRIC FIELD ADSORPTION METHOD

(71) Applicant: LG CHEM, LTD., Seoul (KR)

(72) Inventors: Dongmyung Shin, Daejeon (KR); Sang Ki Chun, Daejeon (KR); Bum Woo Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 81 days.

(21) Appl. No.: 15/737,561

(22) PCT Filed: Mar. 28, 2017

(86) PCT No.: PCT/KR2017/003349
§ 371 (c)(1),
(2) Date: Dec. 18, 2017

(87) PCT Pub. No.: WO2017/188612
PCT Pub. Date: Nov. 2, 2017

(65) Prior Publication Data
US 2018/0114701 A1    Apr. 26, 2018

(30) Foreign Application Priority Data

Apr. 27, 2016 (KR) .......................... 10-2016-0051689

(51) Int. Cl.
*H01L 21/479* (2006.01)
*H01L 21/768* (2006.01)
(Continued)

(52) U.S. Cl.
CPC .............. *H01L 21/479* (2013.01); *B08B 3/10* (2013.01); *B08B 17/02* (2013.01); *F04B 19/00* (2013.01);
(Continued)

(58) Field of Classification Search
None
See application file for complete search history.

(56) References Cited

U.S. PATENT DOCUMENTS 6,500,268 B1    12/2002   Henley
6,526,997 B1 *  3/2003    Henley .................... B08B 6/00
                                                              134/1.3
(Continued)

FOREIGN PATENT DOCUMENTS

JP          09-327673 A    12/1997
JP          10-034098 A    2/1998
(Continued)

*Primary Examiner* — Angel Roman
(74) *Attorney, Agent, or Firm* — Dentons US LLP

(57) ABSTRACT

The present invention relates to a system and a method of removing a foreign material by using an electric field adsorbing scheme, which are capable of easily adsorbing and removing a foreign material on a surface of a film by using an electric field adsorbing scheme through a microcurrent (several micro ampere) voltage driving method, not a surface treatment method, such as plasma discharge processing, corona discharge processing, and air blowing processing, which causes damage to the surface of the film, in a processing process for removing the foreign material on the surface of the film, and particularly, which exclude high pressure discharge processing and the like, thereby decreasing an incurrence rate of a safety accident of an operator and preventing a surface of a film from being scratched.

18 Claims, 13 Drawing Sheets

(51) Int. Cl.
- *H01L 21/02* (2006.01)
- *H01L 21/67* (2006.01)
- *B08B 3/10* (2006.01)
- *B08B 17/02* (2006.01)
- *F04B 19/00* (2006.01)

(52) U.S. Cl.
CPC ...... *F04B 19/006* (2013.01); *H01L 21/02422* (2013.01); *H01L 21/67028* (2013.01); *H01L 21/76865* (2013.01); *H01L 21/02057* (2013.01)

(56) References Cited

U.S. PATENT DOCUMENTS

| | | | |
|---|---|---|---|
| 8,196,594 B2 | 6/2012 | Harano et al. | |
| 2004/0016443 A1* | 1/2004 | Sasaki | B08B 6/00 134/1.3 |
| 2011/0108056 A1* | 5/2011 | Ishizawa | B08B 6/00 134/1 |
| 2013/0192630 A1* | 8/2013 | Okada | H01L 21/67028 134/1.3 |
| 2014/0048098 A1* | 2/2014 | Prahlad | A47L 25/005 134/1 |
| 2015/0017744 A1* | 1/2015 | Jang | H01L 51/56 438/4 |

FOREIGN PATENT DOCUMENTS

| | | |
|---|---|---|
| JP | 2004-335783 A | 11/2005 |
| KR | 10-2008-0038157 A | 5/2008 |

\* cited by examiner

[Figure 1]
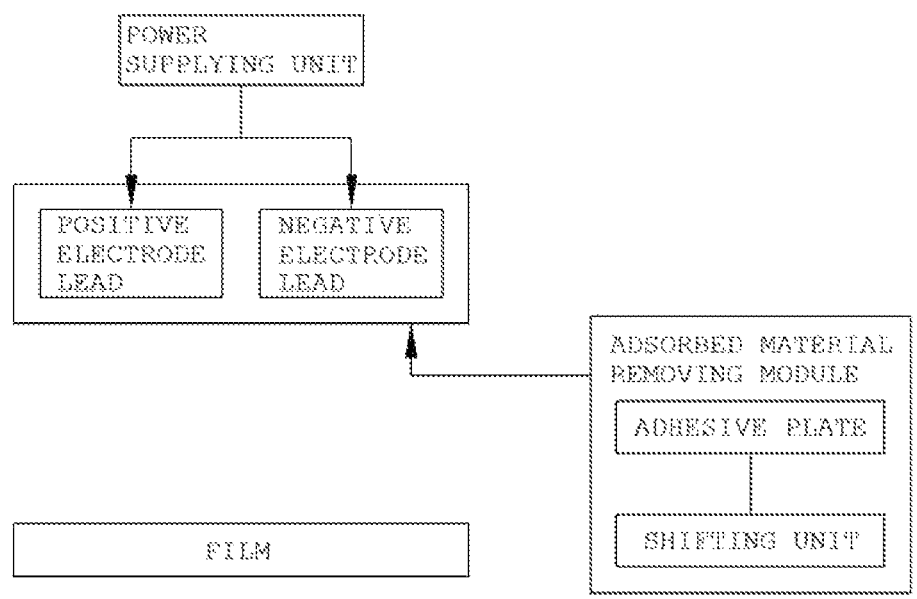

[Figure 2]
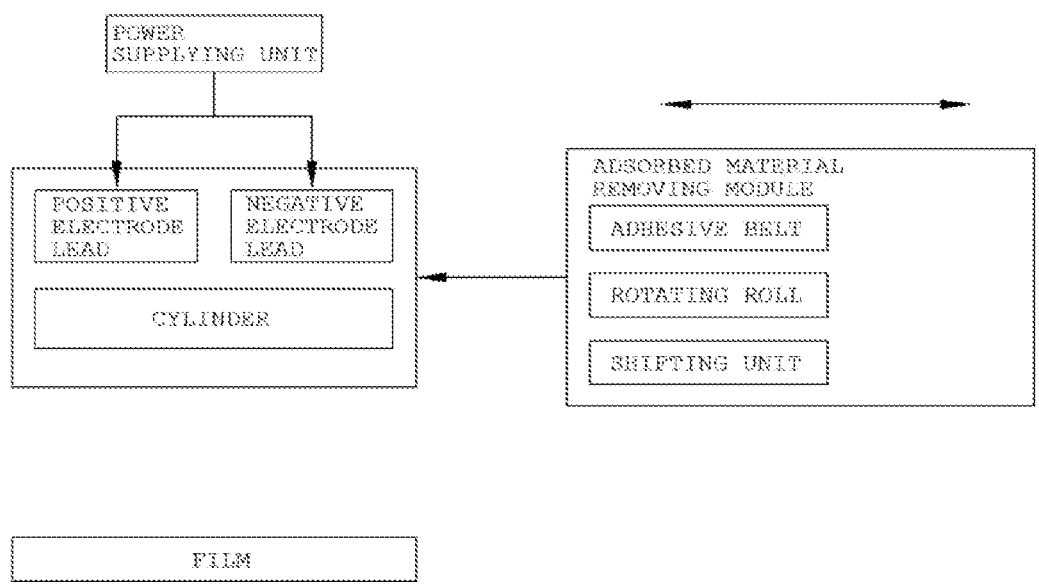

[Figure 3]
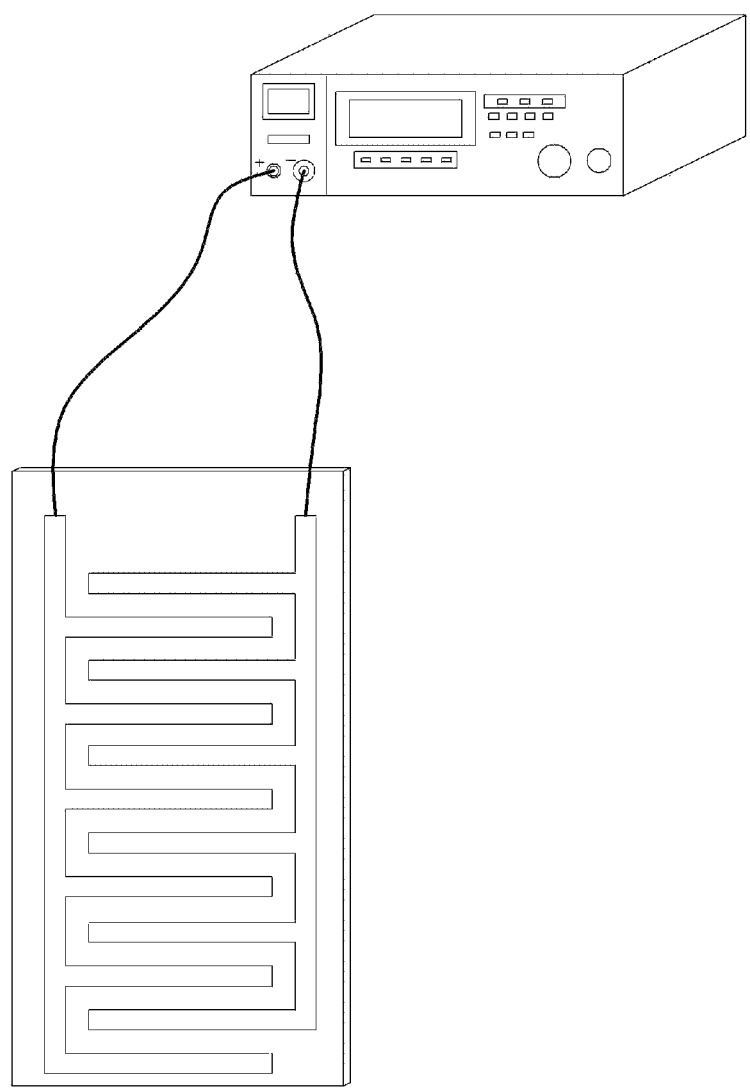

[Figure 7]
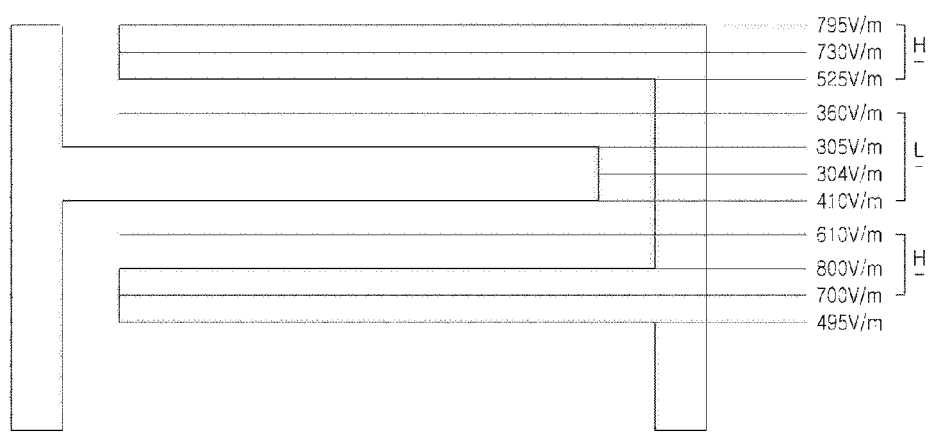

[Figure 8]

[Figure 9]
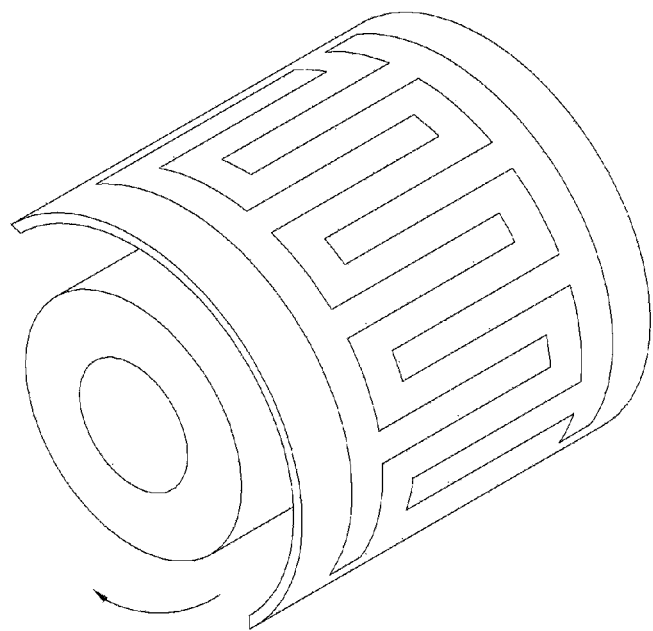

[Figure 10]
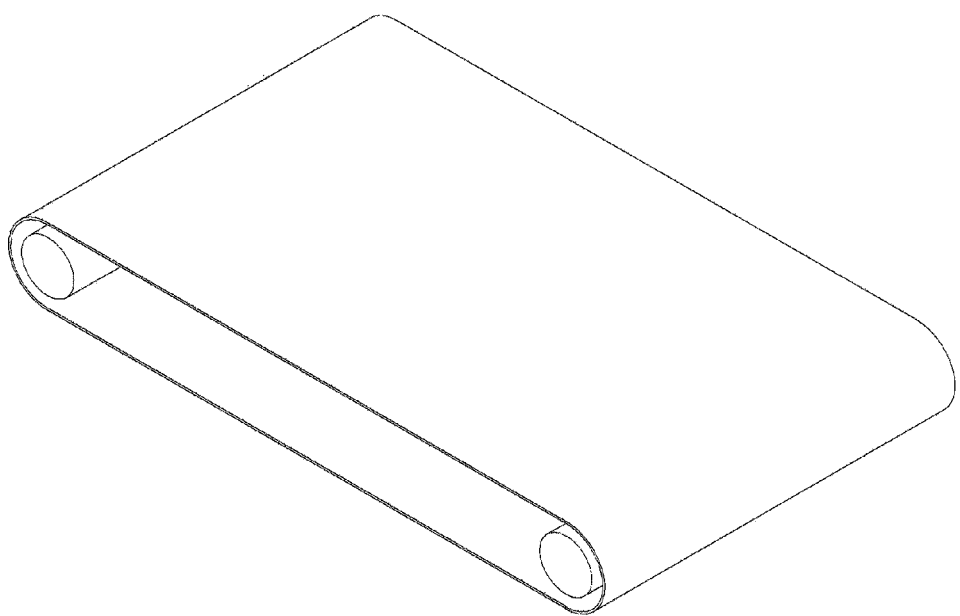

[Figure 11]
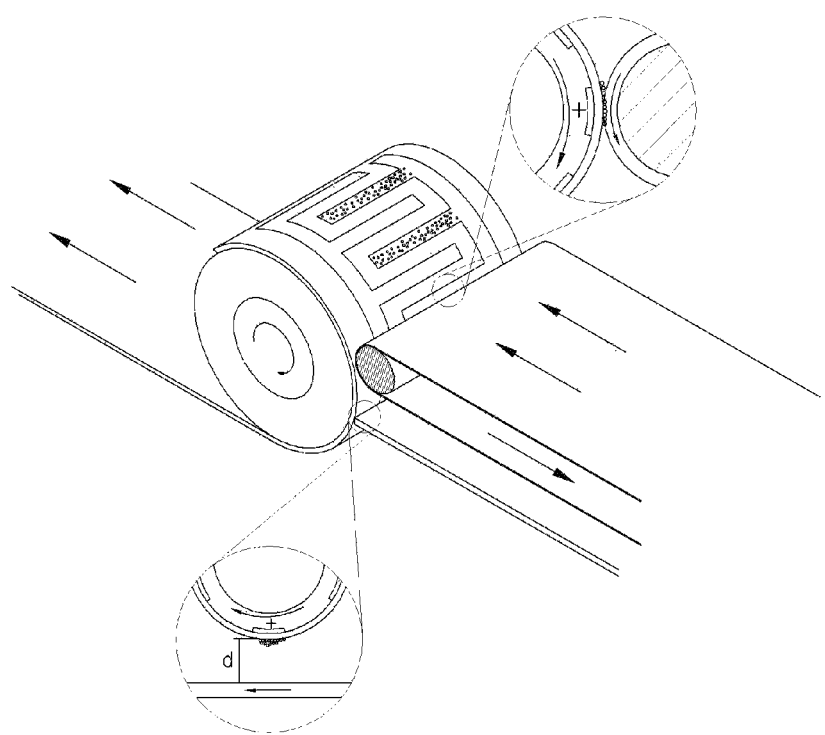

[Figure 13]
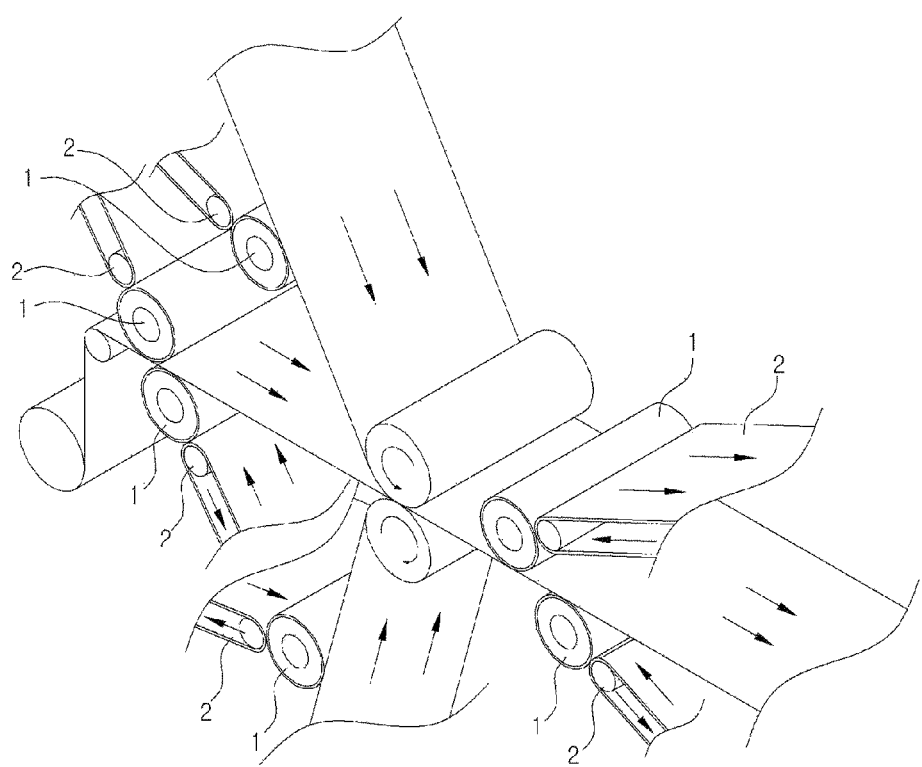

SYSTEM AND METHOD FOR REMOVING FOREIGN SUBSTANCES BY USING ELECTRIC FIELD ADSORPTION METHOD

This application is a National Stage Entry of International Application No. PCT/KR2017/003349, filed on Mar. 28, 2017, and claims the benefit of Korean Application No. 10-2016-0051689, filed on Apr. 27, 2016, all of which are hereby incorporated by reference in their entirety for all purposes as if fully set forth herein.

TECHNICAL FIELD

The present invention relates to a system and a method of removing a foreign material by using an electric field adsorbing scheme, and particularly, to a system and a method of removing a foreign material, which are capable of easily adsorbing and removing a foreign material on a surface of a film by using an electric field adsorbing scheme through a micro-current (several micro ampere) voltage driving method, not a surface treatment method, such as plasma discharge processing, corona discharge processing, and air blowing processing, which causes damage to the surface of the film, in a processing process for removing the foreign material on the surface of the film.

Particularly, the present invention relates to a system and a method of removing a foreign material by using an electric field adsorbing scheme, which exclude high pressure discharge processing and the like, thereby decreasing an incurrence rate of a safety accident of an operator and preventing a surface of a film from being scratched.

BACKGROUND ART

In general, a film may mean a thin film manufactured by forming a specific coating layer in a transparent material, such as celluloid or polyester, and may be variously divided into a photosensitive film, a polarizing film, an enhancement film, a bulletproof film, a mirror film, an insulating film, a blocking film, and a shatterproof film according to the kind of coating layers.

In the meantime, an area of the film which is in contact with air is large, so that floating dust, dust particles, various foreign materials, and the like in the air may be easily attached onto a surface of the film, and in order to fundamentally block the floating materials attached onto the surface of the film, the floating materials are primarily removed by applying vacuum processing equipment used in a semiconductor producing process in the related art.

However, despite the primary vacuum processing equipment, fine dust or other foreign materials introduced through an operator may exist, so that a secondary foreign material removing method, such as high pressure plasma or corona discharge processing and air blowing processing, has been additionally used.

In this case, the plasma or corona discharge processing discharges a high voltage current generated in a generator through an electrode bar and coats a surface of a film by using the discharged current to prevent a foreign material from being attached to the surface of the film, but has a problem in that 1) damage or scratches may be caused to the surface of the film and a problem in that 2) there is a risk of a safety accident of an operator due to the high voltage current generated in the generator, and further, the air blowing has also a problem in that fine scratches may be caused to the surface of the film due to an injection of high pressure air to the surface of the film.

In addition, in the case of the plasma or corona discharge processing in the related art, the discharge processing essentially needs to be performed within a vacuum chamber, so that there is a problem in that a form of the discharge processing equipment is limited according to a form and a size of the vacuum chamber, and thus efficiency of a film manufacturing process may be degraded.

In this respect, in order to solve the problems of the method of removing a foreign substance of a surface of a film in the related art, the present inventor made a system and a method of removing a foreign material by using an electric field adsorbing scheme, which are capable of easily adsorbing and removing a foreign material on a surface of a film by using an electric field adsorbing scheme through a micro-current (several micro ampere) voltage driving method, not a surface treatment method, such as plasma discharge processing, corona discharge processing, and air blowing processing, which causes damage to the surface of the film, in a processing process for removing the foreign material on the surface of the film, and particularly exclude high pressure discharge processing and the like, thereby decreasing an incurrence rate of a safety accident of an operator and preventing a surface of a film from being scratched.

DETAILED DESCRIPTION OF THE INVENTION

Technical Problem

The present invention is conceived to solve the foregoing problems, and provides a system and a method of removing a foreign material by using an electric field adsorbing scheme, which are capable of easily adsorbing and removing a foreign material on a surface of a film by using an electric field adsorbing scheme through a micro-current (several micro ampere) voltage driving method, not a surface treatment method, such as plasma discharge processing, corona discharge processing, and air blowing processing, which causes damage to the surface of the film, in a processing process for removing the foreign material on the surface of the film, and exclude high pressure discharge processing and the like, thereby decreasing an incurrence rate of a safety accident of an operator and preventing a surface of a film from being scratched.

Technical Solution

Among the exemplary embodiments of the present invention, a system for removing a foreign material by using an electric field adsorbing scheme may include: one or more positive electrode leads and one or more negative electrode leads which form an electric field and are positioned at one surface of a flat plate while being alternately positioned with a predetermined interval; and a cover layer which covers external sides of the positive electrode lead and the negative electrode lead.

In the exemplary embodiment, a foreign material at an external side of a film adjacently positioned to the positive electrode lead may be shifted in a direction of the positive electrode lead and adsorbed to a surface of the cover layer according to a generation of electrostatic force by the electric field.

In the exemplary embodiment, the system may further include a power supplying unit which varies a voltage value of power according to the kind of foreign material and supplies the power to the one or more positive electrode leads and the one or more negative electrode leads.

In the exemplary embodiment, the positive electrode lead and the negative electrode lead may have an electrode width corresponding to 0.5 mm to 5 mm.

In the exemplary embodiment, the positive electrode leads and the negative electrode leads may be alternately positioned with an interval corresponding to 0.4 mm to 1.2 mm.

In the exemplary embodiment, the one or more positive electrode leads and the one or more negative electrode leads may form a rotation pattern, in which the straight positive electrode leads and negative electrode leads which are parallel to one another are alternately positioned, or a concentric circle pattern in which ring-shaped positive electrode leads and negative electrode leads are alternately positioned in a concentric circle form.

In the exemplary embodiment, a form of the cover layer may correspond to at least one or more of a film form, in which one or more polymer films for covering are bonded at an external side of the flat plate, and a coating layer form, in which one or more polymer materials for covering are applied onto an external side of the flat plate to form a plurality of coating layers.

In the exemplary embodiment, the system may further include an adsorbed material removing module which removes an adsorbed material adsorbed to a surface of the cover layer.

In the exemplary embodiment, the adsorbed material removing module may include: a adhesive plate which has predetermined cohesion and is formed in a form corresponding to that of the cover layer; and a shifting unit which shifts the adhesive plate in a direction of the surface of the cover layer.

In the exemplary embodiment, the adhesive plate may be in contact with the surface of the cover layer by the shifting unit, so that the adsorbed material may adhere to a surface of the adhesive plate and may be removed from the surface of the cover layer.

According to another exemplary embodiment of the present invention, a method of removing a foreign material by using an electric field adsorbing scheme may include: positioning one or more positive electrode leads and one or more negative electrode leads on one surface of a flat plate while being alternately positioned with a predetermined interval; covering external sides of the positive electrode lead and the negative electrode lead with a cover layer; and shifting a foreign material at an external side of the film adjacently positioned to the positive electrode lead in a direction of the positive electrode lead and adsorbing the foreign material to a surface of the cover layer according to a generation of electrostatic force by an electric field formed by the one or more positive electrode leads and the one or more negative electrode leads.

In the exemplary embodiment, the method may further include: varying, by a power supplying unit, a voltage value of power according to the kind of foreign material; and supplying the varied power to the one or more positive electrode leads and the one or more negative electrode leads.

In the exemplary embodiment, the alternately positioning may include forming the positive electrode lead and the negative electrode lead to have an electrode width corresponding to 0.5 mm to 5 mm.

In the exemplary embodiment, the alternately positioning may include alternately positioning the positive electrode lead and the negative electrode lead to have an interval corresponding to 0.4 mm to 1.2 mm.

In the exemplary embodiment, the alternately positioning may include: alternately positioning the straight positive electrode leads and negative electrode leads which are parallel to one another in a rotation form; and alternately positioning the ring-shaped positive electrode leads and negative electrode leads in a concentric circle form.

In the exemplary embodiment, the covering may include: bonding one or more polymer films for covering to an external side of the flat plate; and applying the one or more polymer materials for covering onto the external side of the flat plate to form a plurality of coating layers.

In the exemplary embodiment, the method may further include removing an adsorbed material adsorbed to a surface of the cover layer through an adsorbed material removing module.

In the exemplary embodiment, the removing of the adsorbed material may include: shifting a adhesive plate which has predetermined cohesion and is formed in a form corresponding to a form of the surface of the cover layer in a direction of the surface of the cover layer through a shifting unit; and bonding the adsorbed material to a surface of the adhesive plate and removing the adsorbed material from the surface of the cover layer according to a contact of the adhesive plate with the surface of the cover layer.

According to yet another exemplary embodiment of the present invention, a system for removing a foreign material by using an electric field adsorbing scheme may include: a cylinder which rotates in one direction; one or more positive electrode leads and one or more negative electrode leads which are positioned along a circumference of an external side of the cylinder while being alternately positioned with a predetermined interval and form an electric field; a cover layer which covers external surfaces of the positive electrode lead and the negative electrode lead; and an adsorbed material removing module which is adjacently positioned to the cylinder and rotates in accordance with the cylinder.

In the exemplary embodiment, according to the generation of electrostatic force by the electric field, a direction of a foreign material at an external side of a film adjacently positioned to the positive electrode lead may be changed to a direction of the positive electrode lead, so that the foreign material may be adsorbed to a surface of the cover layer, and the adsorbed material adsorbed to the surface of the cover layer may be removed from the surface of the cover layer by the adsorbed material removing module.

In the exemplary embodiment, the adsorbed material removing module may include: an adhesive belt having a predetermined area; one or more rotating rolls which rotate the adhesive belt in an opposite direction to a rotation direction of the cylinder; and a shifting unit which shifts the adhesive belt in a direction of the surface of the cover layer.

In the exemplary embodiment, the adhesive belt may be in contact with the surface of the cover layer by the shifting unit and then rotate in an opposite direction to a rotation direction of the cylinder by the one or more rotation rolls, so that the adsorbed material may be adsorbed to a surface of the adhesive belt and may be removed from the surface of the cover layer.

According to still yet another exemplary embodiment of the present invention, a method of removing a foreign material by using an electric field adsorbing scheme may include: positioning one or more positive electrode leads and one or more negative electrode leads along a circumference of an external side of a cylinder rotating in one direction while being alternately positioned with a predetermined interval; covering external sides of the positive electrode lead and the negative electrode lead with a cover layer;

adjacently positioning an adsorbed material removing module rotating in accordance with the cylinder to the cylinder; changing a direction of the foreign material at an external side of a film adjacently positioned to the positive electrode lead to a direction of the positive electrode lead, and adsorbing the foreign material to a surface of the cover layer according to a generation of electrostatic force by the electric field formed by the one or more positive electrode leads and the one or more negative electrode leads; and removing the adsorbed material adsorbed to the surface of the cover layer from the surface of the cover layer by the adsorbed material removing module.

In the exemplary embodiment, the adjacently positioning may include: shifting an adhesive belt having a predetermined area in a direction of a cover layer through a shifting unit to make the adhesive belt be in contact with the cover layer; and making the adhesive belt be in contact with the surface of the cover layer.

In the exemplary embodiment, the removing of the adsorbed material from the surface of the cover layer may include: rotating an adhesive belt which is in contact with the surface of the cover layer in an opposite direction to a rotation direction of the cylinder through one or more rotating rolls; and bonding the adsorbed material to a surface of the adhesive belt and removing the adsorbed material from the surface of the cover layer.

Advantageous Effects

The system and method of removing a foreign material by using an electric field adsorbing scheme according to the present invention use a current having a several micro amperes value, not a high voltage current discharge or a high pressure air injection, thereby preventing a safety accident of an operator according to the high voltage current discharge.

Further, the present invention does not incur any damage or scratches to a surface of a film, thereby not causing a degradation of a quality of a film according to a surface treatment process.

Further, the present invention may adsorb and remove various kinds of foreign material form a surface of a film by using an electric field adsorbing scheme using a generation of a dielectric polarizing phenomenon, regardless of the kind of foreign material.

Further, a foreign material may be primarily adsorbed to and removed from the surface of the film by the adhesive belt having cohesion of the present invention and simultaneously may adhere to the adhesive belt and secondarily completely removed, so that it is possible to remarkably decrease time for a removal of the foreign material from the surface of the film and thus maximize efficiency of a film manufacturing process.

Particularly, the present invention may bond and remove the primarily adsorbed and removed foreign material by rolling the foreign material through the adhesive belt having predetermined cohesion, not by shaking and removing the primarily adsorbed and removed foreign material, thereby preventing a secondary contamination by floating matters.

Further, the present invention may adjust a voltage of power supplied through a separate voltage supply device to several kV to several tens of kV according to the kind of foreign material, thereby increasing an application range of the foreign material.

BRIEF DESCRIPTION OF DRAWINGS

FIG. 1 is a diagram schematically illustrating a configuration of a foreign material removing system 100 according to an exemplary embodiment of the present invention.

FIG. 2 is a diagram schematically illustrating a form of the foreign material removing system 100 illustrated in FIG. 1.

FIG. 3 is a diagram illustrating a state where a foreign material 2 is adsorbed by an positive electrode lead 110a and a negative electrode lead 110b illustrated in FIG. 1.

FIG. 7 is a diagram illustrating the intensity of an electric field according to an interval between the positive electrode lead 110a and the negative electrode lead 110b illustrated in FIG. 1.

FIG. 9 is a diagram illustrating a state where an positive electrode lead 110a' and a negative electrode lead 110b are positioned at an external side of a cylinder 140 illustrated in FIGS. 8(A) and 8(B).

FIG. 10 is a diagram schematically illustrating a form of an adsorbed material removing module 130 illustrated in FIGS. 8(A) and 8(B).

FIG. 11 is a diagram schematically illustrating a state where a foreign material 2 on a film 1 is removed by the cylinder 140, the positive electrode lead 110a', the negative electrode lead 110b', and the adsorbed material removing module 130' illustrated in FIGS. 8(A) and 8(B).

FIG. 13 is a diagram schematically illustrating a state where one or more foreign material removing systems 100' illustrated in FIGS. 8(A) and 8(B) are applied to a three-film laminating process.

MODE FOR CARRYING OUT THE INVENTION

Figure 4A:
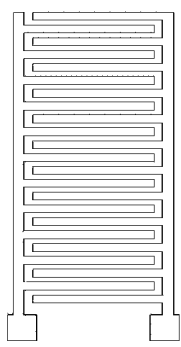
FIGS. 4(A), 4(B), and 4(C) are diagrams illustrating various electrode widths and electrode intervals of the positive electrode lead 110a and the negative electrode lead 110b illustrated in FIG. 1.
Figure 4B:
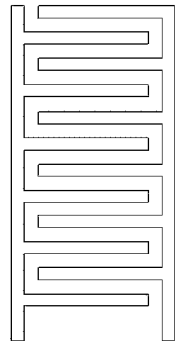

Hereinafter, exemplary embodiments will be provided for helping to understand the present invention. However, the following exemplary embodiment is provided only for helping the person skilled in the art to more easily understand the present invention, and the contents of the present invention is not limited by the exemplary embodiment.

Further, in the present specification, a film 1 may mean a thin film manufactured by forming a specific coating layer in a transparent material, such as celluloid or polyester, and in this case, it is noted that the kind of film 1 is not limited.

Further, in the present specification, a foreign material 2 may be interpreted as a common name of all of the pollution sources, such as floating materials in the air, and various dust, powder, and hair seated on a surface of the film, which are seated and attached onto the surface of the film 1 to contaminate the surface of the film 1.

FIG. 1 is a diagram schematically illustrating a configuration of a foreign material removing system 100 according to an exemplary embodiment of the present invention.

Referring to FIG. 1, the foreign material removing system 100 according to the exemplary embodiment of the present invention may include an positive electrode lead 110a and a negative electrode lead 110b positioned in a flat plate 110, a power supplying unit 120, and an adsorbed material removing module 130.

First, the flat plate 110 may serve as a supporter supporting the positive electrode lead 110a and the negative electrode lead 110b, and an area of the flat plate 110 may be changed in proportional to sizes of the positive electrode lead 110a and the negative electrode lead 110b.

Further, plastic that is a non-conductor and the like may be applied as a material of the flat plate 110, and it is noted that as long as a material is capable of maintaining the forms of the positive electrode lead 110a and the negative electrode lead 110b, in addition to the plastic material, the material, an area, a thickness, and the like of the flat plate 110 are not limited.

The thin positive electrode lead 110a and negative electrode lead 110b having predetermined thicknesses may be positioned on an upper surface or a lower surface of the flat plate 110.

More particularly, the flat plate 110 may be a copper clad laminate CCL formed by laminating a copper layer on an upper surface or a lower surface of a resin, and the positive electrode lead 110a and the negative electrode lead 110b may mean copper plates discriminated as two different plates by etching the copper layer to a specific form.

Accordingly, the positive electrode lead 110a and the negative electrode lead 110b may be positioned while being spaced apart from each other by a specific interval, and when power is supplied from the power supplying unit 120 which is to be described below, the positive electrode lead 110a and the negative electrode lead 110b may form an electric field to generate electrostatic force, thereby adsorbing the foreign material 2 through electrostatic force.

The positive electrode lead 110a and the negative electrode lead 110b will be described in more detail with reference to FIGS. 2 to 7.

Figure 4C:
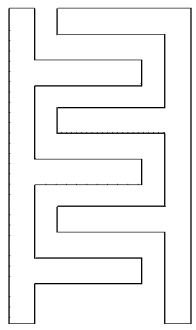
Figure 5A:
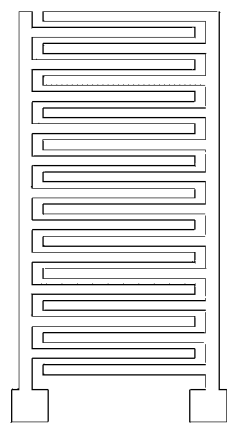
FIGS. 5(A) and 5(B) are diagrams illustrating various forms of the positive electrode lead 110a and the negative electrode lead 110b illustrated in FIG. 1.
Figure 5B:
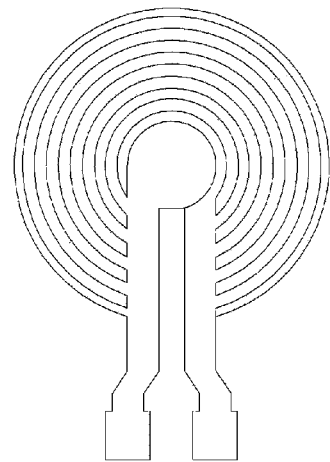
Figure 6A:
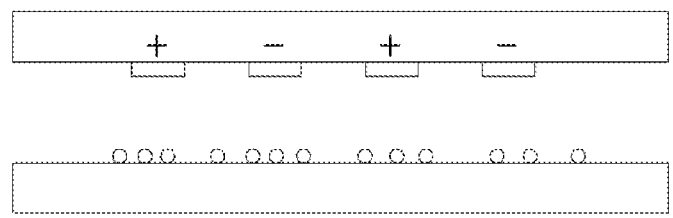
FIGS. 6(A) and 6(B) are diagrams schematically illustrating a spark incurrence situation of an adsorbed material according to an interval between the positive electrode lead 110a and the negative electrode lead 110b illustrated in FIG. 1.
Figure 6B:
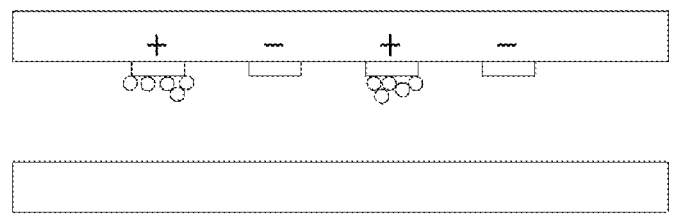

FIG. 2 is a diagram schematically illustrating a form of the foreign material removing system 100 illustrated in FIG. 1, FIG. 3 is a diagram illustrating a state where the foreign material 2 is adsorbed by the positive electrode lead 110a and the negative electrode lead 110b illustrated in FIG. 1, FIGS. 4(A) to 4(C) illustrate various electrode widths and electrode intervals of the positive electrode lead 110a and the negative electrode lead 110b illustrated in FIG. 1, FIGS. 5(A) and 5(B) illustrate an intensity of an electric field according to an interval between the positive electrode lead 110a and the negative electrode lead 110b illustrated in FIG. 1, FIGS. 6(A) and 6(B) schematically illustrate a spark incurrence situation of an adsorbed material according to an interval between the positive electrode lead 110a and the negative electrode lead 110b illustrated in FIG. 1, and FIG. 7 is a diagram illustrating various forms of the positive electrode lead 110a and the negative electrode lead 110b illustrated in FIG. 1.

Referring to FIGS. 2 and 3, one or more positive electrode leads 110a and one or more negative electrode leads 110b are alternately disposed on the flat plate 110 with a predetermined interval, and in this case, all of the one or more positive electrode leads 110a are combined as one to be connected with an positive electrode of the power supplying unit 120, and all of the one or more negative electrode leads 110b are combined to one to be connected with a negative electrode (or a ground GND) of the power supplying unit 120.

Referring to FIG. 3A, since power is not supplied to the positive electrode leads 110a and the negative electrode leads 110b which are alternately disposed, various kinds of foreign materials 2 are attached onto the surface of the film 1 as they are.

However, when power is applied from the power supplying unit 120 as illustrated in FIG. 3B, an electric field may be formed between the one or more positive electrode leads 110a and the one or more negative electrode leads 110b which are alternately disposed to generate electrostatic force, and the electrostatic force generated in this case may adsorb the foreign material attached onto the surface of the film 1.

The power supplying unit 120 may change a voltage value of the supplied power into several kV or several tens of kV according to the kind of foreign material 2 and provide the changed power, and a current value of the power supplied in this case is a micro current corresponding to several micro amperes, thereby not influencing a body of an operator.

In the meantime, an intensity of the formed electric field may be varied according to an interval and a width between the one or more positive electrode leads 110a and the one or more negative electrode leads 110b which are alternately disposed with a predetermined interval therebetween, which will be described in more detail with reference to FIGS. 4(A), 4(B), 4(C), 5(A) and 5(B).

Referring to FIGS. 4(A) to 5(B), the one or more positive electrode leads 110a and the one or more negative electrode leads 110b positioned on the flat plate 110 may also be positioned while being very densely alternated as illustrated in FIG. 4A, and the one or more positive electrode leads 110a and the one or more negative electrode leads 110b may also be positioned while being very loosely alternated as illustrated in FIG. 4C.

For example, the positive electrode lead 110a and the negative electrode lead 110b may be designed to have electrode width values corresponding to 0.5 mm to 5 mm, and further, for example, the positive electrode lead 110a and the negative electrode lead 110b may be positioned to have electrode interval values corresponding to 0.4 mm to 1.2 mm, and a basis of the limitation of the value is described below.

When an electrode width between the positive electrode lead 110a and the negative electrode lead 110b is less than 0.5 mm or is larger than 5 mm, electrostatic force may rather be decreased, so that it is noted that in order to maximize efficiency of electrostatic force and generate optimum electrostatic force, the electrode width between the positive electrode lead 110a and the negative electrode lead 110b may be set to a range of 0.5 mm to 5 mm.

Further, when the an electrode interval between the positive electrode lead 110a and the negative electrode lead 110b is less than 0.4 mm, there is a concern that a short-circuit is generated between the positive electrode lead 110a and the negative electrode lead 110b, and in contrast to this, when an electrode interval between the positive electrode lead 110a and the negative electrode lead 110b is larger than 1.2 mm, electrostatic force may be decreased, so that it is noted that in order to prevent the positive electrode lead 110a and the negative electrode lead 110b from being short-circuited, and maximize efficiency of electrostatic force and generate optimum electrostatic force, the electrode interval between the positive electrode lead 110a and the negative electrode lead 110b may be set to a range of 0.4 mm to 1.2 mm.

In this case, even though the one or more positive electrode leads 110a and the one or more negative electrode leads 110b have the same electrode width, when a thickness of the electrode of each lead is larger, a larger magnetic field may be formed, but even though the one or more positive electrode leads 110a and the one or more negative electrode leads 110b have the same electrode interval, when a width of the electrode of each lead is larger, a smaller magnetic field may be formed.

Accordingly, it is possible to form an optimum electric field formed by the positive electrode lead 110a and the negative electrode lead 110b by increasing a thickness of each of the positive electrode lead 110a and the negative electrode lead 110b or adjusting an electrode interval between the positive electrode lead 110a and the negative electrode lead 110b.

Referring to FIG. 7, FIG. 7 represents the size of an electric field formed according to an electrode interval between the one or more positive electrode leads 110a and the one or more negative electrode leads 110b, and it can be seen that the size of the electric field between the positive electrode lead 110a and the negative electrode lead 110b is decreased in a direction from the positive electrode lead 110a to the negative electrode lead 110b, and is increased again in a direction from the negative electrode lead 110b to the positive electrode lead 110a.

That is, an electric field formed between the positive electrode lead 110a and the negative electrode lead 110b is densely formed in the positive electrode lead 110a, so that the electrostatic force generated in this case is larger in the positive electrode lead 110a than the negative electrode lead 110b, and as a result, the foreign material 2 adsorbed from the film 1 may move toward the positive electrode lead 110a, not the negative electrode lead 110b, and be adsorbed.

In this case, it can be seen that the electric field is formed with different sizes based on a position on the positive electrode lead 110a, and a size of the electric field formed at a center portion of the positive electrode lead 110a may be considerably larger than a size of the electric field formed at borders at both sides of the positive electrode lead 110a.

In the meantime, it is noted that the electrode interval and the electrode width between the positive electrode lead 110a and the negative electrode lead 110b are not limited to the foregoing values, and the values may be changed without a limit according to electrostatic power required for removing the foreign material.

In the exemplary embodiment, when the electrode interval between the positive electrode lead 110a and the negative electrode lead 110b is too small, spark may be generated due to the foreign material 2, which will be described in more detail with reference to FIGS. 6A and 6B.

Referring to FIG. 6A, when the electrode interval between the one or more positive electrode leads 110a and the one or more negative electrode leads 110b is smaller than a size of the foreign material 2, so that the one or more positive electrode leads 110a and the one or more negative electrode leads 110a are very densely formed, a probability that the foreign material 2 crosses the positive electrode lead 110a and the negative electrode lead 110b is increased, and in this case, the foreign material 2 serves as a conductor between the positive electrode lead 110a and the negative electrode lead 110b to cause a spark by a short-circuit.

In the meantime, referring to FIG. 6B, when the one or more positive electrode leads 110a and the one or more negative electrode leads 110b are loosely formed so that the electrode interval between the one or more positive electrode leads 110a and the one or more negative electrode leads 110b is larger than a size of the foreign material 2, a probability that the foreign material 2 crosses the positive electrode lead 110a and the negative electrode lead 110b is decreased, and thus a probability in causing spark by a short-circuit is also decreased.

However, even though the positive electrode leads 110a and the negative electrode leads 110b have the loose electrode interval as illustrated in FIG. 6B, when the foreign material longer than the corresponding electrode interval is adsorbed, the foreign material 2 may cross the positive electrode lead 110a and the negative electrode lead 110b, so that it can be seen that it cannot still be free from a spark generation problem due to the foreign material.

Accordingly, a cover layer (not illustrated) covering the positive electrode lead 110a and the negative electrode lead 110b may be formed in an external surface of the flat plate 110 according to the present invention.

The cover layer may be formed in a form covering an entire external side of the flat plate 110 or a form covering any one or more of the positive electrode lead 110a and the negative electrode lead 110b, and may serve to prevent the positive electrode lead 110a and the negative electrode lead 110b from being exposed to the outside and prevent the positive electrode lead 110a and the negative electrode lead 110b from being in direct contact with the foreign material 2 even though the foreign material 2 is adsorbed by electrostatic force and crosses the positive electrode lead 110a and the negative electrode lead 110b.

The cover layer may correspond to a form of a film formed by bonding a plurality of polymer films for covering to one surface (the surface, in which the positive electrode lead 110a and the negative electrode lead 110b are positioned) of the flat plate 110, or a form of a plurality of coating layers formed by applying (or coating) one or more polymer materials for covering onto any one or more of the positive electrode lead 110a and the negative electrode lead 110b (in this case, the polymer film or the polymer material may be a non-conductor).

In the meantime, it is noted that as long as the cover layer serves to prevent a spark between the positive electrode lead 110a and the negative electrode lead 110b, a material, a form, and the like of the cover layer are not limited.

In the meantime, one or more positive electrode leads 110a and one or more negative electrode leads 110b may be formed in various forms, and this will be described in more detail with reference to FIGS. 5(A) and 5(B).

Referring to FIG. 5A, it can be seen that the straight positive electrode leads 110a and negative electrode leads 110b which are parallel to one another are alternately positioned to form a rotation pattern, and referring to FIG. 5B, it can be seen that the ring-shaped positive electrode leads 110a and negative electrode leads 110b are alternately positioned in a concentric circle to form a concentric circle pattern.

The rotation pattern illustrated in FIG. 5A may more effectively adsorb and remove the foreign material on the surface of the film which is long in one direction, and the concentric circle pattern illustrated in FIG. 5B may more effectively adsorb and remove the foreign material on the surface of the film which has a slightly larger area.

Accordingly, the flat plate 110 according to the present invention may be formed in the form corresponding to the rotation pattern or the concentric circle pattern, and it is noted that in addition to the foregoing patterns, as long as the positive electrode lead 110a and the negative electrode lead 110b are positioned with a specific electrode interval to form an electric field and generate electromagnetic force, the pattern formed by the positive electrode lead 110a and the negative electrode lead 110b is not limited.

Next, the adsorbed material removing module 130 may serve to bond and remove the adsorbed material adsorbed to the surface of the cover layer from the cover layer.

More particularly, the adsorbed material removing module 130 may include a adhesive plate 130a which has predetermined cohesion and is formed in a form corresponding to the form of the cover layer, and a shifting unit 130b which shifts the adhesive plate 130b in a direction of the cover layer to make the adhesive plate 130b be in contact with the cover layer.

Accordingly, when the foreign material 2 is shifted in the direction of the positive electrode lead 110a by the electromagnetic force generated by the positive electrode lead 110a and the negative electrode lead 110b and is adsorbed to the cover layer covering the positive electrode lead 110a, the shifting unit 130b may shift the adhesive plate 130a in a lower direction of the cover layer. Then, the adhesive plate 130a is in contact with the cover layer and the adsorbed material (the foreign material 2) adsorbed to the cover layer may adhere to the adhesive plate 130a by the cohesion of the adhesive plate 130a and removed.

Through the repetition of the series of processes, the foreign material 2 attached onto the surface of the film 1 may be adsorbed and removed from the surface of the film 1 by the positive electrode lead 110a and the negative electrode lead 110b, and the foreign material 2 adsorbed to the cover layer may adhere to and removed from the cover layer by the adsorbed material removing module 130, and as a result, the film 1 and the cover layer may always maintain non-contaminated states.

Next, a foreign material removing system 100' according to another exemplary embodiment of the present invention will be described with reference to FIGS. 8 to 13.

In this case, some constituent elements among the constituent elements illustrated in FIGS. 8 to 13 may serve the functions corresponding to those of the constituent elements described with reference to FIGS. 1 to 7, or may be the same constituent elements with different reference numerals, so that a detailed description of the constituent element serving the same function will be omitted, and new constituent elements which are not described, mentioned, and included in FIGS. 1 to 7 will be mainly described. More particularly, an positive electrode lead 110a', a negative electrode lead 110b, and a power supplying unit 120' illustrated in FIGS. 8 to 13 are the same constituent elements as the positive electrode lead 110a, the negative electrode lead 110b, and the power supplying unit 120b illustrated in FIGS. 1 to 7, respectively, but have different reference numerals from those of the positive electrode lead 110a, the negative electrode lead 110b, and the power supplying unit 120b illustrated in FIGS. 1 to 7, so that it is noted that it is okay to refer to FIGS. 1 to 7 with respect to the positive electrode lead 110a', the negative electrode lead 110b', and the power supplying unit 120'.

Figure 8A:
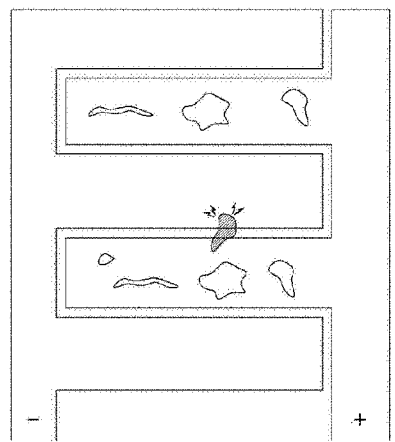
FIGS. 8(A) and 8(B) are diagrams schematically illustrating a configuration of a foreign material removing system 100' according to another exemplary embodiment of the present invention.
Figure 8B:
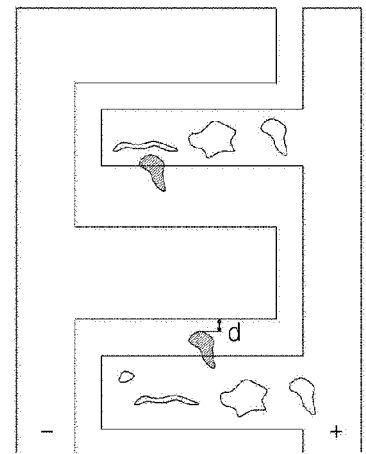
Figure 12A:
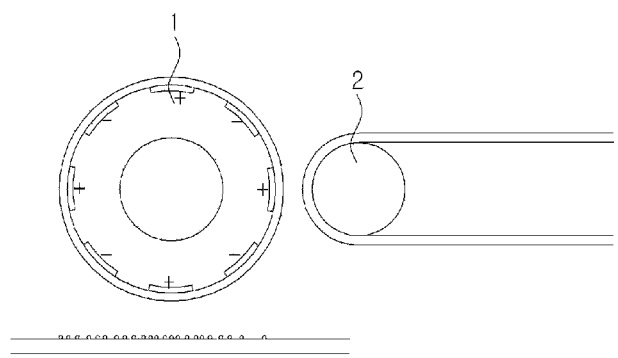
FIGS. 12(A) and 12(B) are diagrams schematically illustrating a state where the foreign material 2 is removed illustrated in FIG. 11 viewed at a lateral side.
Figure 12B:
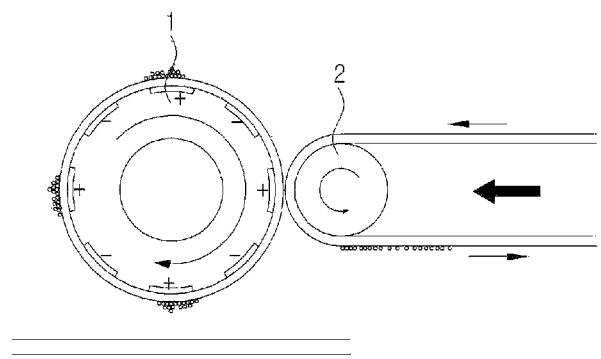

FIGS. 8(A) and 8(B) illustrate a configuration of the foreign material removing system 100' according to another exemplary embodiment of the present invention, FIG. 9 is a diagram illustrating a state where the positive electrode lead 110a' and the negative electrode lead 110b' are positioned at an external side of a cylinder 140 illustrated in FIGS. 8(A) and 8(B), and FIG. 10 is a diagram schematically illustrating a form of an adsorbed material removing module 130' illustrated in FIGS. 8(A) and 8(B).

Referring to FIGS. 8(A), 8(B) and 9, first, a flexible flat plate 110' has the same form and serves the same function as that of the flat plate 110 illustrated in FIG. 1, but may be formed in a flexible plastic material.

Accordingly, the flexible flat plate 110' may be formed in a form, of which both distal ends are curved so as to cover an external surface of the cylinder 140 which is to be described below, and may easily cover the external side of the cylinder 140 by the flexible material.

Further, a cover layer may be formed at an external side of the flexible flat plate 110' in a form of a film or coating layer similar to the flat plate 110 illustrated in FIG. 1, and thus a spark by an adsorbed material may be prevented.

Next, the cylinder 140 may mean a cylindrical rotor which is rotatable in one direction (for example, a clockwise direction or a counterclockwise direction), and it is noted that the flexible flat plate 110' may also be rotated according to the rotation of the cylinder 140, and the positive electrode lead 110a' and the negative electrode lead 110b positioned at one side surface of the flexible flat plate 110' may also be rotated together.

Accordingly, according to the rotation of the positive electrode lead 110a' and the negative electrode lead 110b along the cylinder 140, an electromagnetic field formed in the positive electrode lead 110a' and the negative electrode lead 110b and electromagnetic force generated according to the electromagnetic field are also rotated along the positive electrode lead 110a', and as a result, a foreign material 2 on a film 1 may be continuously removed by the rotated electromagnetic force.

Accordingly, when a rotation speed of the cylinder 140 is increased, the foreign material on the surface of the film 1 passing through the lower side of the positive electrode lead 110a' may be periodically removed with a higher speed.

Next, referring to FIG. 10, the adsorbed material removing module 130' may include an adhesive belt 130a' having predetermined cohesion, one or more rotating rolls 130b' rotating the adhesive belt 130a' in one direction, and a shifting unit 130c' shifting the adhesive belt 130a' in a direction of a surface of the cover layer.

The adhesive belt 130a' may serve a function corresponding to that of the adhesive plate 130a illustrated in FIG. 1, and be formed in a form of a belt having a predetermined length, so that the adhesive belt 130a' is rotatable by the one or more rotating rolls 130b'.

Further, the shifting unit 130c' may shift the adhesive belt 130a' in a direction of the flexible flat plate 110' when the cylinder 140 rotates to start to adsorb and remove the foreign material 2 on the surface of the film 1.

Accordingly, it is possible to continuously remove the adsorbed material adsorbed to the positive electrode lead 110a' and the negative electrode lead 110b' covering the cylinder 140, and a process of continuously removing the adsorbed material will be described in more detail with reference to FIGS. 11 and 12.

FIG. 11 is a diagram schematically illustrating a state where the foreign material 2 on the film 1 is removed by the cylinder 140, the positive electrode lead 110a', the negative electrode lead 110b', and the adsorbed material removing module 130' illustrated in FIGS. 8(A) and 8(B), and FIGS. 12(A) and 12(B) schematically illustrate a state where the foreign material 2 is removed illustrated in FIG. 11 viewed at a lateral side.

Referring to FIGS. 11 and 12, the film 1 is continuously supplied in a direction from a right side to a left side of the drawing, and the cylinder 140 rotates in the same direction as the rotation direction of the film 1 in a state (a non-contact state) of being spaced apart from an upper side of the film 1 by a predetermined interval d. Further, the flexible flat plate 110' is rotated together at the external side of the rotating cylinder 140, and the adhesive belt 130a' which is in contact with the cover layer formed at the external side of the flexible flat plate 110' rotates in an opposite direction to the rotation direction of the cylinder 140 in a state of being in contact with the cylinder 140.

In this case, the foreign material 2 attached on the surface of the film 1 is shifted in a direction of the rotating positive electrode lead 110a', and the shifted foreign material 2 may be adsorbed to the cover layer to be removed.

Simultaneously, the adsorbed material (the foreign material 2) adsorbed to the cover layer may adhere to the adhesive belt 130' and removed from the cover layer by the cohesion of the adhesive belt 130a' which is in contact with the cover layer while rotating in the opposite direction to the rotation direction of the cylinder 140, and according to the repetition of the series of processes, the process of adsorbing and removing the foreign material 2 on the surface of the film 1 and the process of bonding and removing the adsorbed material of the cover layer may be continuously performed with a high speed.

Next, a state where the foreign material removing system 100' illustrated in FIGS. 8 to 12 is applied to a film laminating process will be described with reference to FIG. 13.

FIG. 13 is a diagram schematically illustrating a state where one or more foreign material removing systems 100' illustrated in FIGS. 8(A) and 8(B) are applied to a three-film laminating process.

Herein, the three-film laminating process may mean a process of laminating three different kinds of a, b, and c films are laminated, and the number of foreign material removing systems 100' applied in this case may be six or more.

For example, two foreign material removing systems 100' may be applied for removing the foreign materials attached onto both surfaces of a film a, two foreign material removing systems 100' may be applied for removing the foreign materials attached onto both surfaces of a film b, and two foreign material removing systems 100' may be applied for removing the foreign materials attached onto both surfaces of a film c.

In the meantime, the series of foreign material removing process performed by each of the foreign material removing systems 100' illustrated in FIG. 13 are the same as the process illustrated in FIGS. 11 and 12, so that a detailed description thereof will be omitted. Further, it is noted that the number of foreign material removing systems 100' is not limited to the foregoing numbers, and may be changed according to a film laminating process without a limitation.

As described above, the foreign material removing system according to the present invention uses a current of several micro amperes values, so that it is possible to prevent a safety accident of an operator due to a discharge of a high-voltage current, the foreign material removing system according to the present invention does not incur any damage or scratch to the surface of the film through a non-contact method, thereby not causing a degradation of a quality of the film according to the surface treatment process, and particularly, the foreign material removing system according to the present invention uses a dielectric polarizing phenomenon, thereby adsorbing and removing various kinds of foreign materials regardless of the kind of foreign material.

In addition to this, the foreign material may be primarily adsorbed and removed from the surface of the film by using the adhesive belt having predetermined cohesion and simultaneously adhere to the adhesive belt and secondarily completely removed, so that it is possible to remarkably decrease time for a removal of the foreign material from the surface of the film and thus maximize efficiency of a film manufacturing process.

The present invention has been described with reference to the exemplary embodiments, but those skilled in the art may understand that the present invention may be variously modified and changed within the scope without departing from the spirit and the area of the present invention described in the accompanying claims.

The invention claimed is:

1. A system for removing a foreign material by using an electric field adsorbing scheme, the system comprising:
   one or more positive electrode leads and one or more negative electrode leads positioned at one surface of a flat plate, and which generate an electric field and
   a cover layer which covers external sides of the positive electrode lead and the negative electrode lead; and
   wherein a foreign material at an external side of a film adjacently positioned to the positive electrode lead is shifted in a direction of the positive electrode lead and adsorbed to a surface of the cover layer because of an electrostatic force of the electric field,
   wherein the one or more positive electrode leads and the one or more negative electrode leads are arranged in:
      an alternating pattern, in which straight positive electrode leads and negative electrode leads are alternately positioned parallel to each other; or
      a concentric circular pattern, in which ring-shaped positive electrode leads and negative electrode leads are alternately positioned in a concentric circle form, and
   wherein each of the one or more positive electrode leads and each of the one or more negative electrode leads has an electrode width corresponding to 0.5 mm to 5 mm, and wherein an interval between each of the one or more positive electrode leads and each of the one or more negative electrode leads corresponds to 0.4 mm to 1.2 mm.

2. The system of claim 1, further comprising:
   a power supplying unit which varies a voltage value of power according to the kind of foreign material and supplies the power to the one or more positive electrode leads and the one or more negative electrode leads;
   an adsorbed material removing module which removes an adsorbed material adsorbed to a surface of the cover layer; and
   wherein the adsorbed material removing module includes:
      an adhesive plate, which has predetermined cohesion and in a form corresponding to that of the cover layer; and
      a shifting unit which shifts the adhesive plate in a direction of the surface of the cover layer, and
      wherein the adhesive plate is in contact with the surface of the cover layer via the shifting unit, so that the adsorbed material adheres to a surface of the adhesive plate and is removed from the surface of the cover layer.

3. The system of claim 1, wherein a form of the cover layer corresponds to at least one or more of:
   a film form, in which one or more polymer films are bonded at an external side of the flat plate, and
   a coating layer form, in which one or more polymer materials are applied onto an external side of the flat plate to form a plurality of coating layers.

4. A method of removing a foreign material by using an electric field adsorbing scheme, the method comprising:

positioning one or more positive electrode leads and one or more negative electrode leads on one surface of a flat plate;

covering external sides of the positive electrode lead and the negative electrode lead with a cover layer; and shifting a foreign material at an external side of the film adjacently positioned to the positive electrode lead in a direction of the positive electrode lead and adsorbing the foreign material to a surface of a cover layer because of an electrostatic force of an electric field generated by the one or more positive electrode leads and the one or more negative electrode leads;

varying, by a power supplying unit, a voltage value of power according to the kind of foreign material; and supplying the varied power to the one or more positive electrode leads and the one or more negative electrode leads; and removing an adsorbed material adsorbed to a surface of the cover layer through an adsorbed material removing module.

5. The method of claim 4, wherein the positioning one or more positive electrode leads and one or more negative electrode leads includes:

forming the each of the one or more positive electrode leads and each of the one or more negative electrode leads to have an electrode width corresponding to 0.5 mm to 5 mm;

positioning straight positive electrode leads and negative electrode leads parallel to one another in an alternating pattern; and positioning ring-shaped positive electrode leads and negative electrode leads alternately in a concentric circle pattern, wherein an interval between each of the one or more positive electrode leads and each of the one or more negative electrode leads corresponds to 0.4 mm to 1.2 mm.

6. The method of claim 4, wherein the covering includes:

bonding one or more polymer films for covering to an external side of the flat plate; and applying the bonded one or more polymer materials for covering onto the external side of the flat plate to form a plurality of coating layers.

7. The method of claim 4, wherein the removing of the adsorbed material includes:

shifting an adhesive plate, which has a predetermined cohesion and a form corresponding to a form of the surface of the cover layer, in a direction of the surface of the cover layer through a shifting unit; and bonding the adsorbed material to a surface of the adhesive plate and removing the adsorbed material from the surface of the cover layer by contacting the adhesive plate with the surface of the cover layer.

8. A system for removing a foreign material by using an electric field adsorbing scheme, the system comprising:

a cylinder, which rotates in one direction;

one or more positive electrode leads and one or more negative electrode leads positioned along a circumference of an external side of the cylinder, wherein the one or more positive electrode leads and one or more negative electrode leads form an electric field;

a cover layer, which covers external surfaces of the one or more positive electrode leads and the one or more negative electrode leads; and an adsorbed material removing module which is adjacently positioned to the cylinder, wherein the adsorbed material removing module rotates in accordance with a rotation direction of cylinder, wherein a direction of a foreign material at an external side of a film adjacently positioned to the one or more positive electrode leads is changed to a direction of the one or more positive electrode leads by an electrostatic force of the electric field, so that the foreign material is adsorbed to a surface of the cover layer, and wherein the adsorbed material adsorbed to the surface of the cover layer is removed from the surface of the cover layer by the adsorbed material removing module.

9. The system of claim 8, further comprising:

a power supplying unit which varies a voltage value of power according to the kind of foreign material and supplies the power to the one or more positive electrode leads and the one or more negative electrode leads.

10. The system of claim 8, wherein the positive electrode lead and the negative electrode lead are arranged in:

an alternating pattern, in which straight positive electrode leads and negative electrode leads are alternately arranged parallel to each other; or a concentric circular pattern, in which ring-shaped positive electrode leads and negative electrode leads are alternately positioned in a concentric circle form, and wherein each of the one or more positive electrode leads and each of the one or more negative electrode leads has an electrode width corresponding to 0.5 mm to 5 mm, and wherein an interval between each of the one or more positive electrode leads and each of the one or more negative electrode leads corresponds to 0.4 mm to 1.2 mm.

11. The system of claim 8, wherein a form of the cover layer corresponds to at least one or more of a film form, in which one or more polymer films are bonded at external sides of the positive electrode lead and the negative electrode lad, and a coating layer form, in which one or more polymer materials are applied onto external sides of the positive electrode lead and the negative electrode lead to form a plurality of coating layers.

12. The system of claim 8, wherein the adsorbed material removing module includes:

an adhesive belt having a predetermined area;

one or more rotating rolls, which rotate the adhesive belt in an opposite direction to a rotation direction of the cylinder; and a shifting unit, which shifts the adhesive belt in a direction of the surface of the cover layer, and wherein the adhesive belt is in contact with the surface of the cover layer via the shifting unit, and wherein the adhesive belt rotates in an opposite direction to the rotation direction of the cylinder by the one or more rotation rolls, so that the adsorbed material is adsorbed to a surface of the adhesive belt and is removed from the surface of the cover layer.

13. A method of removing a foreign material by using an electric field adsorbing scheme, the method comprising:

positioning one or more positive electrode leads and one or more negative electrode leads along a circumference of an external side of a cylinder rotating in one direction;

covering external sides of the positive electrode lead and the negative electrode lead with a cover layer;

adjacently positioning an adsorbed material removing module, which rotates in a same direction as a rotating direction of the cylinder;

changing a direction of the foreign material at an external side of a film adjacently positioned to the positive electrode lead to a direction of the positive electrode lead; and adsorbing the foreign material to a surface of the cover layer by an electrostatic force of an electric field generates by the one or more positive electrode leads and the one or more negative electrode leads; and removing the adsorbed material adsorbed to the surface of the cover layer from the surface of the cover layer by the adsorbed material removing module.

14. The method of claim 13, further comprising:

varying, by a power supplying unit, a voltage value of power according to the kind of foreign material; and supplying the varied power to the one or more positive electrode leads and the one or more negative electrode leads through the power supplying unit.

15. The method of claim 13, wherein the positioning one or more positive electrode leads and one or more negative electrode leads includes forming each of the one or more positive electrode leads and each of the one or more negative electrode leads to have an electrode width corresponding to 0.5 mm to 5 mm;

positioning straight positive electrode leads and negative electrode leads parallel to one another in an alternating pattern; and positioning the ring-shaped positive electrode leads and negative electrode leads alternately in a concentric circle pattern, wherein an interval between each of the one or more positive electrode leads and each of the one or more negative electrode leads corresponds to 0.4 mm to 1.2 mm.

16. The method of claim 13, wherein the covering includes:

bonding one or more polymer films to external sides of the positive electrode lead and the negative electrode lead; and applying the bonded one or more polymer materials onto the external side of the positive electrode lead and the negative electrode lead to form a plurality of coating layers.

17. The method of claim 13, wherein the adjacently positioning includes:

shifting an adhesive belt having a predetermined area in a direction of a cover layer through a shifting unit to bring the adhesive belt in contact with the cover layer; and contacting the adhesive belt with the surface of the cover layer.

18. The method of claim 13, wherein the removing of the adsorbed material from the surface of the cover layer includes:

rotating an adhesive belt which is in contact with the surface of the cover layer in an opposite direction to a rotation direction of the cylinder through one or more rotating rolls; and bonding the adsorbed material to a surface of the adhesive belt and removing the adsorbed material from the surface of the cover layer.

* * * * *